(12) United States Patent
You et al.

(10) Patent No.: US 11,587,475 B2
(45) Date of Patent: Feb. 21, 2023

(54) DISPLAY DEVICE

(71) Applicant: Samsung Display Co., Ltd., Yongin-si (KR)

(72) Inventors: Young Min You, Asan-si (KR); Joo Suc Kim, Seoul (KR); Hyeon Jeong Oh, Yeosu-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1 day.

(21) Appl. No.: 17/064,534

(22) Filed: Oct. 6, 2020

(65) Prior Publication Data

US 2021/0104184 A1 Apr. 8, 2021

(30) Foreign Application Priority Data

Oct. 8, 2019 (KR) .......................... 10-2019-0124561

(51) Int. Cl.
*H05K 5/00* (2006.01)
*G09F 9/30* (2006.01)
*H05K 1/18* (2006.01)

(52) U.S. Cl.
CPC ............ *G09F 9/301* (2013.01); *H05K 1/189* (2013.01); *H05K 2201/10128* (2013.01)

(58) Field of Classification Search
CPC ............ G09F 9/301; H05K 1/189; H05K 2201/10128
USPC ........................................................ 361/749
See application file for complete search history.

(56) References Cited

U.S. PATENT DOCUMENTS

| | | | |
|---|---|---|---|
| 4,461,429 A | 6/1984 | Goekler et al. | |
| 10,211,611 B2 | 2/2019 | Bier et al. | |
| 10,555,414 B2 * | 2/2020 | Park | H05K 1/028 |
| 2014/0098549 A1 * | 4/2014 | Hack | G06F 1/1626 |
| | | | 362/418 |
| 2015/0131024 A1 * | 5/2015 | Sakamoto | G02F 1/1345 |
| | | | 349/58 |
| 2015/0205166 A1 * | 7/2015 | Kageyama | G02F 1/133608 |
| | | | 349/58 |
| 2015/0212359 A1 * | 7/2015 | Wada | G02F 1/133382 |
| | | | 348/794 |
| 2017/0290184 A1 * | 10/2017 | Kim | H04M 1/0274 |
| 2018/0234595 A1 * | 8/2018 | Lim | H04N 5/2258 |

FOREIGN PATENT DOCUMENTS

| | | |
|---|---|---|
| KR | 10-2014-0128733 | 11/2014 |
| KR | 10-2018-0029190 | 3/2018 |

* cited by examiner

*Primary Examiner* — Binh B Tran
(74) *Attorney, Agent, or Firm* — H.C. Park & Associates, PLC

(57) ABSTRACT

A display device includes a substantially rigid display panel, a printed circuit board spaced apart from the display panel in a first direction and having at least one angled portion, a flexible member having a first portion connected to the display panel and a second portion spaced from the first portion, the second portion being connected to a first portion of the printed circuit board, and a support attached to the display panel and the printed circuit board to support the printed circuit board.

20 Claims, 9 Drawing Sheets

DISPLAY DEVICE

CROSS-REFERENCE TO RELATED APPLICATION

This application claims priority from and the benefit of Korean Patent Application No. 10-2019-0124561, filed on Oct. 8, 2019, which is hereby incorporated by reference for all purposes as if fully set forth herein.

BACKGROUND

Field

Exemplary implementations of the invention relate generally to display devices and, more particularly, to a display device having a display panel connected to a support to improve durability of the display device.

Discussion of the Background

A display device may include a liquid crystal display device, an organic light is emitting display device, a plasma display device, an electrophoretic display device, or the like according to an emission type.

The display device may generally have a display panel for displaying an image and a printed circuit board (PCB), a flexible printed circuit board (FPC), or the like for driving the display panel. The display panel may be electrically connected to the printed circuit board, the flexible printed circuit board, or the like through pads to receive signals, voltages, or the like.

The above information disclosed in this Background section is only for understanding of the background of the inventive concepts, and, therefore, it may contain information that does not constitute prior art.

SUMMARY

Applicant realized that during manufacture of display devices, display panels and attached components such as printed circuit boards may be bent due to the weight of the panel and attached components, thereby causing defects in electrical and/or mechanical connections that reduce reliability and/or performance.

Display devices constructed according to the principles and exemplary implementations of the invention improve durability of the display device by having a support attached to a display panel and a printed circuit board of the display device. For example, a support member attached to the display panel and the printed circuit board may support the printed circuit board and the display panel to prevent or minimize bending of the printed circuit board due to its weight of the printed circuit board, and thereby improving the durability and/or reliability of the display device.

Additional features of the inventive concepts will be set forth in the description which follows, and in part will be apparent from the description, or may be learned by practice of the inventive concepts.

According to an aspect of the invention, a display device includes a substantially rigid display panel, a printed circuit board spaced apart from the display panel in a first direction and having at least one angled portion, a flexible member having a first portion connected to the display panel and a second portion spaced from the first portion, the second portion being connected to a first portion of the printed circuit board, and a support attached to the display panel and the printed circuit board to support the printed circuit board.

The display device may further include a protective film disposed on a lower surface of the display panel.

The support may be attached to a lower surface of the lower protective film and a lower surface of the printed circuit board.

The display device may further include a plurality of adhesive members disposed between the display panel and the support and between the printed circuit board and the support.

The printed circuit board may include a first extending portion extending in the first direction from the second portion of the flexible member and a second extending portion angled in a second direction from the first extending portion. The plurality of adhesive members may include one or more first adhesive member disposed between the display panel and the support, one or more second adhesive member disposed between the first portion of the printed circuit board and the support, and one or more third adhesive member disposed between the second portion of the printed circuit board and the support.

The second direction may be substantially perpendicular to the first direction.

The printed circuit board may further include a third extending portion extended angled in a third direction from the second extending portion. The plurality of adhesive members may further include one or more fourth adhesive member disposed between the third portion of the printed circuit board and the support.

The third direction may be substantially perpendicular to the second direction and substantially opposite to the first direction.

The support may include polyethylene terephthalate (PET).

The support may include a support member having a first hole overlapping the flexible member and a second hole overlapping the printed circuit board.

The first hole and the second hole may be formed at an inner portion of the support member.

The first hole and the second hole may be formed at a side portion of the support member.

The flexible member may include a flexible printed circuit, the first portion may include a first end of the flexible printed circuit, the second portion may include a second end of the flexible printed circuit spaced from the first end in the first direction, the first portion of the printed circuit board may include a first end of the printed circuit board, with the second end of the flexible printed circuit being connected to the first end of the printed circuit board, and may further include a connector connected to an external device disposed at a second end of the printed circuit board.

According to another aspect of the invention, a display device includes a substantially rigid display panel, a first printed circuit board spaced apart from the display panel in a first direction and extending in the first direction, a second printed circuit board connected to the first printed circuit board and being angled in a second direction from the first printed circuit board, a flexible member having a first portion connected to the display panel and a second portion spaced from the first portion, the second portion being connected to a first portion of the first printed circuit board, and a support attached to the display panel, the first printed circuit board, and the second printed circuit board to support the first printed circuit board and the second printed circuit board from the display panel.

The display device may further include a protective film disposed on a lower surface of the display panel.

The support may include a support member attached to a lower surface of the protective film, a lower surface of the first printed circuit board, and a lower surface of the second printed circuit board.

The display device may further include a plurality of adhesive members disposed between the display panel and the support, between the first printed circuit board and the support, and between the second printed circuit board and the support.

The first printed circuit board may include a main printed circuit board and the second printed circuit board may include a secondary printed circuit board, and the main and secondary printed circuit board may be attached through a connector.

The support may not overlap the connector.

The support may overlap the connector.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
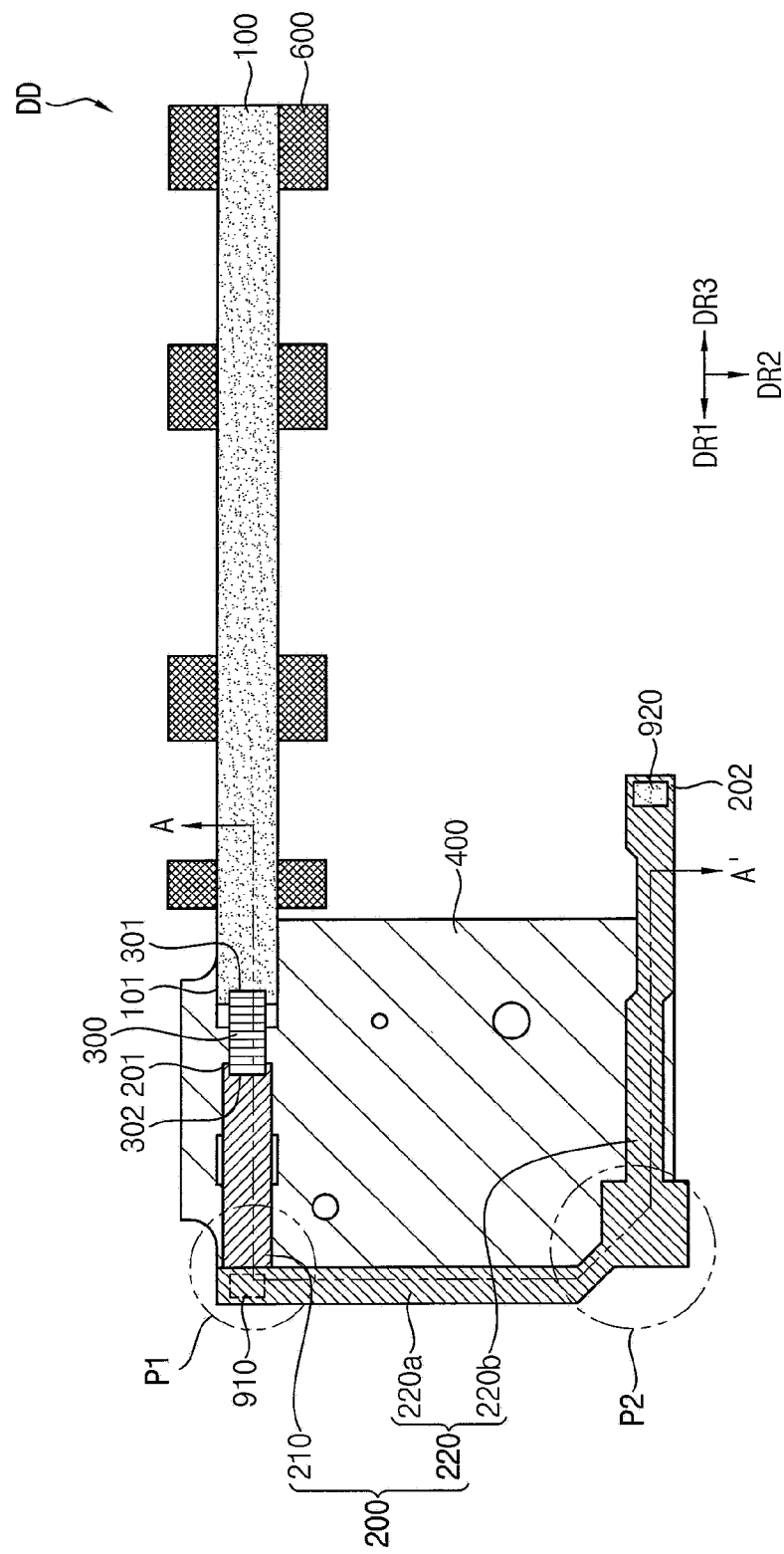
FIG. 1 is a plan view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
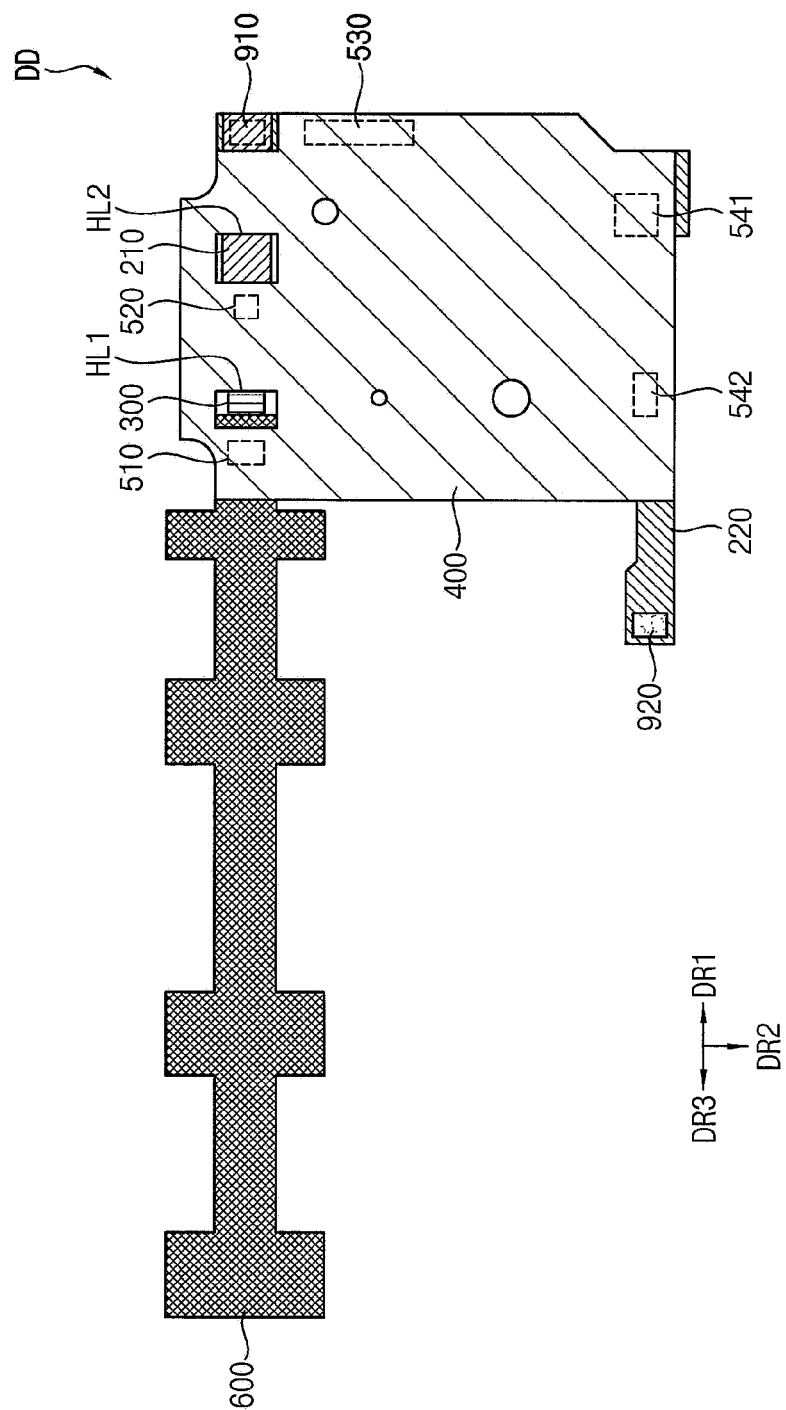
FIG. 2 is a bottom view of the display device of FIG. 1.

FIG. 1 is a plan view of an exemplary embodiment of a display device constructed according to the principles of the invention. FIG. 2 is a bottom view of the display device of FIG. 1, and FIG. 3 is a cross-sectional view taken along line A-A' of the display device of FIG. 1.

Figure 3:
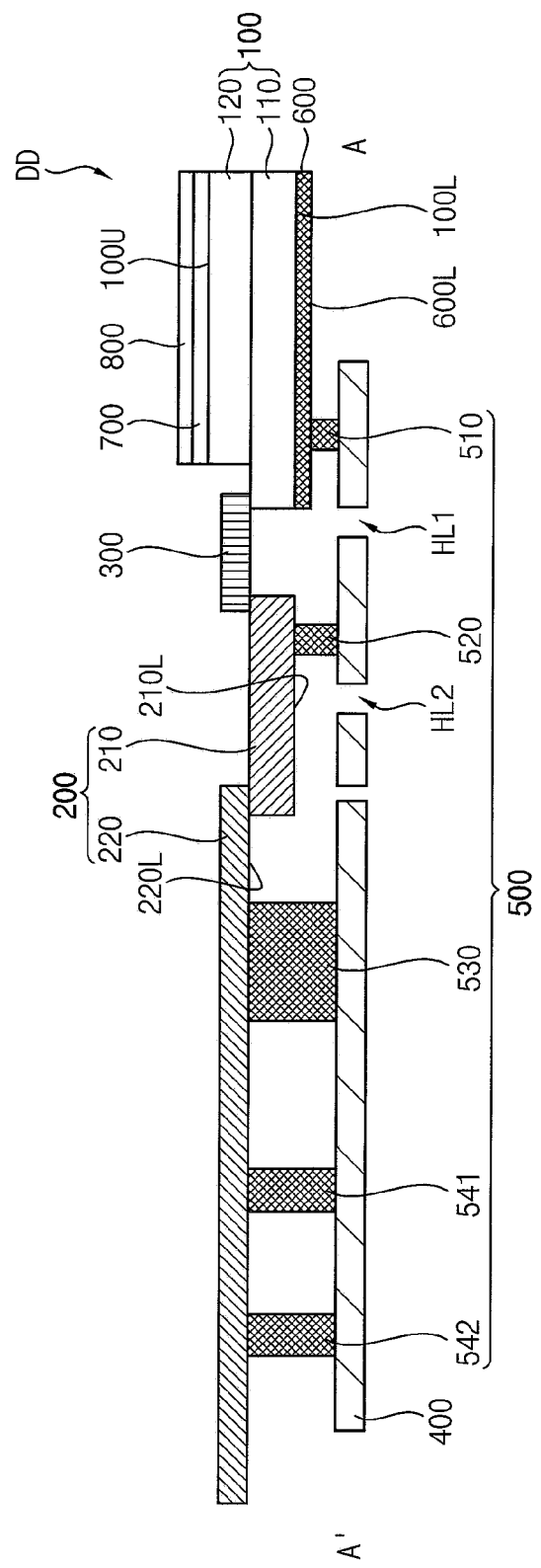
FIG. 3 is a cross-sectional view taken along line A-A' of the display device of FIG. 1.

Referring to FIGS. 1, 2, and 3, a display device DD according to an exemplary embodiment may include a display panel 100, a printed circuit board 200, a flexible member, which may be formed in the form a flexible printed circuit 300, a support, which may be in the form a support member 400, a plurality of adhesive members 500: 510, 520, 530, 541 and 542 of FIGS. 2 and 3, and a lower protective film 600. The display device DD may further include a polarization plate 700 of FIG. 5 and an upper protective film 800 of FIG. 5.

The display panel 100 may display an image. The display panel 100 may have an elongate shape extending in a first direction DR1 in a plan view.

Figure 5:
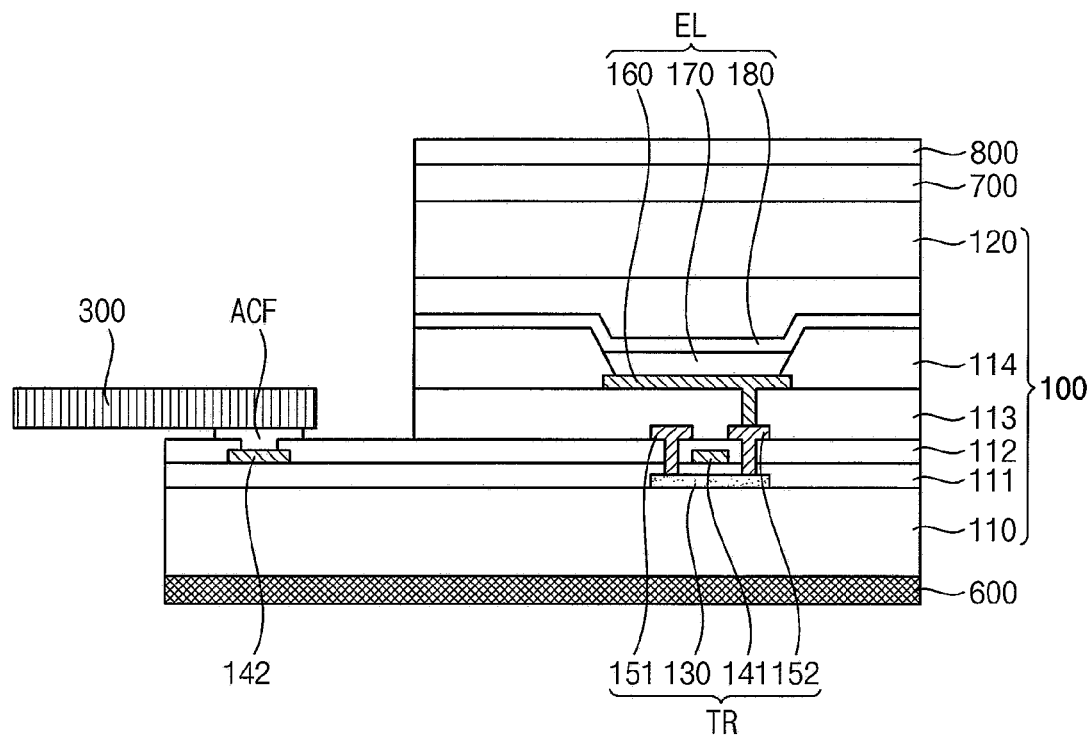
FIG. 5 is a cross-sectional view of an exemplary embodiment of a portion of the display device of FIG. 1.

Referring to FIG. 3, the display panel 100 may include a first substrate 110, a second substrate 120 disposed on and overlapping the first substrate 110, and a display unit TR and EL of FIG. 5 disposed between the first substrate 110 and the second substrate 120. In an exemplary embodiment, the display unit may generate an image, and the image may be displayed toward the second substrate 120, in other words, toward an upper surface 100U of the display panel 100.

In an exemplary embodiment, each of the first substrate 110 and the second substrate 120 may include glass. In such an exemplary embodiment, the display panel 100 may be rigid.

Referring to FIG. 3, the lower protective film 600 may be disposed on a lower surface 100L of the display panel 100. For example, the lower protective film 600 may be disposed under the first substrate 110. The lower protective film 600 may have a black color. The lower protective film 600 may protect the lower surface 100L of the display panel 100, and may prevent a user who views the display device DD from above the display device DD from recognizing an object below the display device DD.

Referring to FIG. 3, the polarization plate 700 may be disposed on the upper surface 100U of the display panel 100. For example, the polarization plate 700 may be disposed on the second substrate 120. The polarization plate 700 may prevent reflection of external light of the display device DD.

Referring to FIG. 3, the upper protective film 800 may be disposed on the polarization plate 700. The upper protective film 800 may protect an upper surface of the polarization plate 700.

The printed circuit board 200 may provide signals, voltages, or the like for driving the display panel 100 to the display panel 100. Referring to FIG. 1, the printed circuit board 200 may be spaced apart in the first direction DR1 from the display panel 100. For example, a first end 201 of the printed circuit board 200 may be spaced apart from an end 101 of the display panel 100 by a predetermined interval. The printed circuit board 200 may have at least one angled portion, such as angled portions P1 and P2, in a plan view.

The flexible printed circuit 300 may be disposed between the display panel 100 and the printed circuit board 200 to connect the display panel 100 to the printed circuit board 200. A first end 301 of the flexible printed circuit 300 may be connected to the end 101 of the display panel 100, and a second end 302 (i.e., the opposite end of the first end 301), which is positioned in the first direction DR1 from the first end 301, may be connected to the first end 201 of the printed circuit board 200. The signals, the voltages, or the like generated from the printed circuit board 200 may be supplied to the display panel 100 through the flexible printed circuit 300.

In an exemplary embodiment, the flexible printed circuit 300 may include plastic or the like. In such an exemplary embodiment, the flexible printed circuit 300 may be flexible.

In an exemplary embodiment, the printed circuit board 200 may include a first portion 210 extending in the first direction DR1 from the second end 302 of the flexible printed circuit 300, a second portion 220a angled in a second direction DR2 from the first portion 210 at a first angled portion P1, and a third portion 220b angled in a third direction DR3 from the second portion 220a at a second angled portion P2. For example, the second direction DR2 may be substantially perpendicular to the first direction DR1. Further, the third direction DR3 may be substantially perpendicular to the second direction DR2 and substantially opposite to the first direction DR1.

The printed circuit board 200 may include a main printed circuit board 210 and a secondary printed circuit board 220. The main printed circuit board 210 may be spaced apart from the display panel 100 in the first direction DR1, and may extend in the first direction DR1. For example, the main printed circuit board 210 may be the first portion 210 of the printed circuit board 200. The secondary printed circuit board 220 may be connected to the main printed circuit board 210. In an exemplary embodiment, the main printed circuit board 210 and the secondary printed circuit board 220 may be connected through a first connector 910.

The secondary printed circuit board 220 may be angled from the main printed circuit board 210 in the second direction DR2. For example, the secondary printed circuit board 220 may include the second portion 220a and the third portion 220b of the printed circuit board 200.

A second connector 920 connected to an external device may be disposed at a second end 202 of the printed circuit board 200. The display device DD may be electrically connected to the external device through the second connector 920.

The support member 400 may be attached to the display panel 100 and the printed circuit board 200 to support the printed circuit board 200 from the display panel 100. Specifically, the support member 400 may be attached to the display panel 100, the main printed circuit board 210, and the secondary printed circuit board 220 to support the main printed circuit board 210 and the secondary printed circuit board 220 from the display panel 100.

In a comparative example according to the prior art, when holding an end of the display panel 100 extending in the first direction DR1 during the transfer of the display device for assembly or the like, the flexible printed circuit 300 may be bent due to the weight of the printed circuit board 200, and, therefore, the durability of the display device may be degraded. However, in the display device DD according to an exemplary embodiment, the support member 400 may be attached to the display panel 100 and the printed circuit board 200 to support the printed circuit board 200 from the display panel 100, so that the flexible printed circuit 300 may not be bent, and the durability of the display device DD may be improved.

In an exemplary embodiment, the support member 400 may include polyethylene terephthalate (PET).

For example, referring to FIGS. 2 and 3, the support member 400 may be attached to a lower surface 600L of the lower protective film 600 and a lower surface of the printed circuit board 200. Specifically, referring to FIG. 3, the support member 400 may be attached to the lower surface 600L of the lower protective film 600, a lower surface 210L of the main printed circuit board 210, and a lower surface 220L of the secondary printed circuit board 220 via adhesive members 500, discussed in more detail herein.

Referring to FIGS. 2 and 3, the support member 400 may include a first hole HL1 overlapping the flexible printed circuit 300 and a second hole HL2 overlapping the printed circuit board 200. For example, the second hole HL2 may overlap the main printed circuit board 210. In the manufacturing process of the display device DD, the lower surface of the flexible printed circuit 300 may be observed through the first hole HL1.

For example, the first hole HL1 and the second hole HL2 may be formed at an inner portion of the support member 400 as shown in FIG. 2. In such an exemplary embodiment, each of the first hole HL1 and the second hole HL2 may have a quadrangular shape.

Referring to FIG. 2, the support member 400 may not overlap the first connector 910. In other words, the lower surface 210L of a portion of the main printed circuit board 210 connected to the secondary printed circuit board 220 may be exposed by the support member 400.

Referring to FIG. 3, the adhesive members 500: 510, 520, 530, 541 and 542, may be disposed between the lower protective film 600 and the support member 400 and between the printed circuit board 200 and the support member 400. The adhesive members 500 may attach the lower protective film 600 to the support member 400, and may attach the printed circuit board 200 to the support member 400. For example, each of the adhesive members 500 may be a double-sided tape.

The adhesive members 500 may include one or more first adhesive members 510 disposed between the lower protective film 600 and the support member 400, one or more second adhesive members 520 disposed between the first portion 210 of the printed circuit board 200 and the support member 400, one or more third adhesive members 530 disposed between the second portion 220a of the printed circuit board 200 and the support member 400, and one or more fourth adhesive member 541 and 542 disposed between the third portion 220b of the printed circuit board 200 and the support member 400. For example, the second adhesive member 520 may be disposed between the main printed circuit board 210 and the support member 400, and the third adhesive member 530 and the fourth adhesive member 541 and 542 may be disposed between the secondary printed circuit board 220 and the support member 400.

In an exemplary embodiment, the adhesive members 500 may include one first adhesive member 510, one second adhesive member 520, one third adhesive member 530, and two fourth adhesive members 541 and 542. However, the exemplary embodiments are not limited thereto, and in another exemplary embodiment, the adhesive members 500 may include two or more first adhesive members, two or more second adhesive members, two or more third adhesive members, and/or one or three or more fourth adhesive members.

In an exemplary embodiment, the planar shapes of the first adhesive member 510, the second adhesive member 520, the third adhesive member 530, and the fourth adhesive members 541 and 542 may be different from each other. For example, planar areas of the first adhesive member 510, the second adhesive member 520, the third adhesive member 530, and the fourth adhesive members 541 and 542 may be different from each other.

Figure 4:
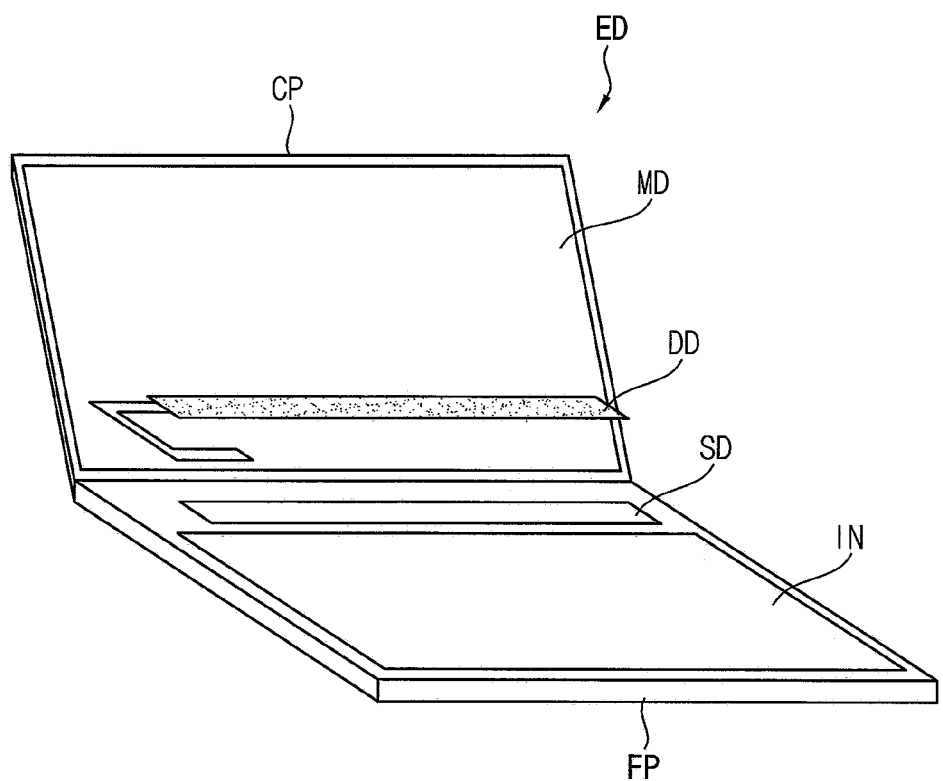
FIG. 4 is a perspective view of an exemplary embodiment of an electronic device including the display device of FIG. 1.

FIG. 4 is a perspective view of an exemplary embodiment of an electronic device including the display device DD of FIG. 1.

Referring to FIGS. 1 and 4, the display device DD according to an exemplary embodiment may be included in an electronic device ED. For example, the electronic device ED may be a portable computer, however, the exemplary embodiment is not limited thereto.

The electronic device ED may include a floor portion FP and a cover portion CP which are rotatably connected. An input portion IN and a secondary display portion SD may be disposed in the floor portion FP, and a main display portion MD may be disposed in the cover portion CP. The display device DD according to the exemplary embodiments of the invention may be disposed on the secondary display portion SD, and may be connected to the floor portion FP of the electronic device ED through the second connector 920 of FIG. 1 which is disposed on the second end 202 of FIG. 1 of the printed circuit board 200.

In an exemplary embodiment, the display device DD may be disposed on the electronic device ED after removing the support member 400 from the display device DD. For example, the support member 400 may be removed from the display device DD, after transferring the display device DD on which the support member 400 is attached and connecting the display device DD to the floor portion FP of the electronic device ED through the second connector 920.

FIG. 5 is a cross-sectional view of an exemplary embodiment of a portion of the display device DD of FIG. 1.

Referring to FIG. 5, the display panel 100 may include the first substrate 110, the second substrate 120, and the display unit disposed between the first substrate 110 and the second substrate 120. The display unit may include a transistor TR and a light emitting element EL electrically connected to the transistor TR. The transistor TR may include an active layer 130, a gate electrode 141, a source electrode 151, and a drain electrode 152, and the light emitting element EL may include a first electrode 160, an emission layer 170, and a second electrode 180.

The active layer 130 may be disposed on the first substrate 110. In an exemplary embodiment, the active layer 130 may include amorphous silicon, polysilicon, or the like. In another exemplary embodiment, the active layer 130 may include an oxide semiconductor. The active layer 130 may include a source region, a drain region, and a channel region disposed between the source region and the drain region. Each of the source region and the drain region may be doped with P-type or N-type impurities.

A first insulation layer 111 may be disposed on the active layer 130. The first insulation layer 111 may be disposed between the active layer 130 and the gate electrode 141 to insulate the gate electrode 141 from the active layer 130. The first insulation layer 111 may include an inorganic insulation material such as silicon oxide, silicon nitride, silicon oxynitride, or the like.

The gate electrode 141 overlapping the active layer 130 and a pad electrode 142 spaced apart from the gate electrode 141 may be disposed on the insulation layer 111. For example, the gate electrode 141 may overlap the channel region of the active layer 130. Each of the gate electrode 141 and the pad electrode 142 may include a conductive material such as molybdenum (Mo), copper (Cu), or the like.

A second insulation layer 112 may be disposed on the gate electrode 141 and the pad electrode 142. The second insulation layer 112 may be disposed between the gate electrode 141 and the source electrode 151 and between the gate electrode 141 and the drain electrode 152 to insulate the source electrode 151 and the drain electrode 152 from the gate electrode 141. The second insulation layer 112 may include an inorganic insulation material such as silicon oxide, silicon nitride, silicon oxynitride, or the like.

The source electrode 151 and the drain electrode 152, which are connected to the active layer 130, may be disposed on the second insulation layer 112. For example, the source electrode 151 may contact the source region of the active layer 130 through a contact hole formed in the first insulation layer 111 and the second insulation layer 112. Further, the drain electrode 152 may contact the drain region of the active layer 130 through a contact hole formed in the first insulation layer 111 and the second insulation layer 112. Each of the source electrode 151 and the drain electrode 152 may include a conductive material such as aluminum (Al), titanium (Ti), copper (Cu), or the like. In an exemplary embodiment, each of the source electrode 151 and the drain electrode 152 may have a multilayer structure in which a titanium layer, an aluminum layer, and a titanium layer are stacked.

A third insulation layer 113 may be disposed on the source electrode 151 and the drain electrode 152. The third insulation layer 113 may provide a planarized surface over the source electrode 151 and the drain electrode 152. The third insulation layer 113 may include an organic insulation material such as polyimide (PI) or the like.

The first electrode 160 connected to the drain electrode 152 may be disposed on the third insulation layer 113. For example, the first electrode 160 may contact the drain electrode 152 through a contact hole formed in the third insulation layer 113. The first electrode 160 may include a conductive material such as metal, alloy, or transparent conductive oxide. For example, the first electrode 160 may include silver (Ag), indium tin oxide (ITO), or the like. In an exemplary embodiment, the first electrode 160 may have a multilayer structure in which an indium tin oxide layer, a silver layer, and an indium tin oxide layer are stacked.

A fourth insulation layer 114 may be disposed on the first electrode 160. The fourth insulation layer 114 may have an opening exposing at least a portion of the first electrode 160. In an exemplary embodiment, the opening may expose a center portion of the first electrode 160, and the fourth insulation layer 114 may cover a peripheral portion of the first electrode 160. The fourth insulation layer 114 may include an organic insulation material such as polyimide (PI) or the like.

The emission layer 170 may be disposed on the first electrode 160 exposed by the opening. The emission layer 170 may be disposed between the first electrode 160 and the second electrode 180. The emission layer 170 may include at least one of an organic light emitting material and a quantum dot.

In an exemplary embodiment, the organic light emitting material may include a low molecular organic compound or a high molecular organic compound. For example, the low molecular organic compound may include copper phthalocyanine, diphenylbenzidine (N, N'-diphenylbenzidine), dihydroxyquinoline aluminum (tris-(8-hydroxyquinoline) aluminum), and the like. The high molecular organic compound may include poly ethylenedioxythiophene (poly(3,4-ethylenedioxythiophene), polyaniline, polyphenylenevinylene, polyfluorene, and the like.

In an exemplary embodiment, the quantum dot may include a core including a group II-VI compound, a group III-V compound, a group IV-VI compound, a group IV element, a group IV compound, and a combination thereof. In one exemplary embodiment, the quantum dot can have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

The second electrode 180 may be disposed on the emission layer 170. The second electrode 180 may be spaced apart from the first electrode 160, and may overlap the first electrode 160. In an exemplary embodiment, the second electrode 180 may also be disposed on the fourth insulation layer 114. The second electrode 180 may include a conductive material such as metal, alloy, or transparent conductive oxide. For example, the second electrode 180 may include aluminum (Al), platinum (Pt), silver (Ag), magnesium (Mg), gold (Au), chromium (Cr), tungsten (W), titanium (Ti) and the like.

The second substrate 120 may be disposed on the second electrode 180.

The flexible printed circuit 300 may be connected to the pad electrode 142. The flexible printed circuit 300 may be disposed on the second insulation layer 112. The pad electrode 142 and the flexible printed circuit 300 may be electrically connected by an anisotropic conductive film (ACF) interposed between the pad electrode 142 and the flexible printed circuit 300.

Figure 6:
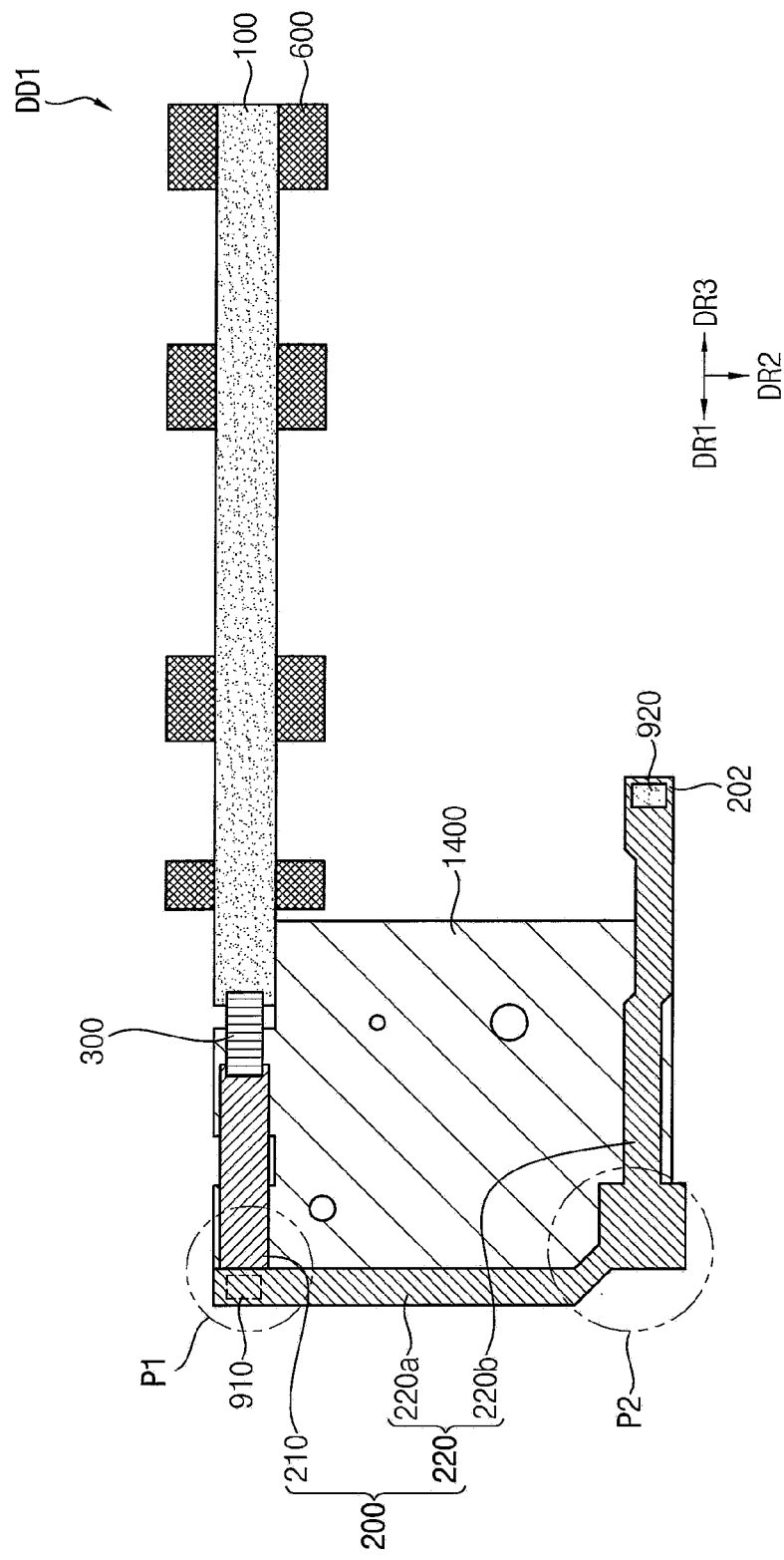
FIG. 6 is a plan view of another exemplary embodiment of a display device constructed according to the principles of the invention.
Figure 7:
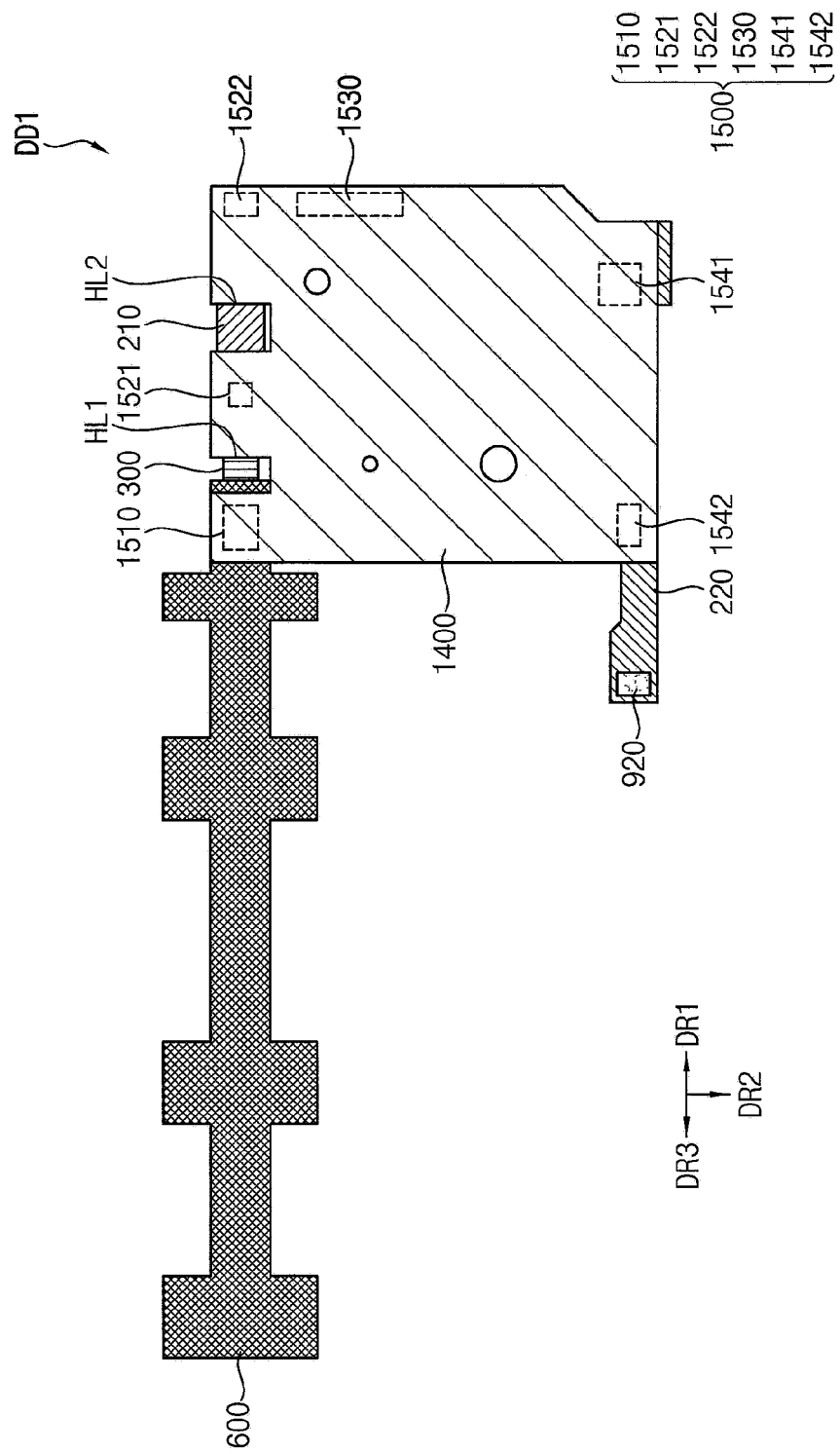
FIG. 7 is a bottom view of the display device of FIG. 6.

FIG. 6 is a plan view of another exemplary embodiment of a display device constructed according to the principles of the invention. FIG. 7 is a bottom view of the display device of FIG. 6.

Referring to FIGS. 6 and 7, a display device DD1 according to an exemplary embodiment may include a display panel 100, a printed circuit board 200, a flexible printed circuit 300, a support member 1400, a plurality of adhesive members 1500, and a lower protective film 600. The display device DD1 described with reference to FIGS. 6 and 7 may be substantially the same as or similar to the display device DD described with reference to FIGS. 1 to 5 except for the support member 1400 and the adhesive members 1500. Accordingly, descriptions on elements of the display device DD1 described with reference to FIGS. 6 and 7, which are substantially the same as or similar to those of the display device DD described with reference to FIGS. 1 to 5, will not be repeated to avoid redundancy.

Referring to FIG. 7, the support member 1400 may include a first hole HL1 overlapping the flexible printed circuit 300 and a second hole HL2 overlapping the printed circuit board 200, and the first hole HL1 and the second hole HL2 may be formed at a side portion of the support member 1400. In such an exemplary embodiment, each of the first hole HL1 and the second hole HL2 may have a recessed shape extending toward an inner portion of the support member 1400 from the side portion of the support member 1400.

Referring to FIGS. 6 and 7, the support member 1400 may overlap the first connector 910 of FIG. 6. In other words, a lower surface of a portion of the main printed circuit board 210 connected to the secondary printed circuit board 220 may be covered by the support member 1400.

The adhesive members 1500: 1510, 1521, 1522, 1530, 1541 and 1542 may be disposed between the lower protective film 600 and the support member 1400 and between the printed circuit board 200 and the support member 1400. The adhesive members 1500 may include one or more first adhesive members 1510 disposed between the lower protective film 600 and the support member 1400, one or more second adhesive members 1521 and 1522 disposed between the first portion 210 of FIG. 6 of the printed circuit board 200 and the support member 1400, one or more third adhesive members 1530 disposed between the second portion 220a of FIG. 6 of the printed circuit board 200 and the support member 1400, and one or more fourth adhesive members 1541 and 1542 disposed between the third portion 220b of FIG. 6 of the printed circuit board 200 and the support member 1400. For example, the second adhesive members 1521 and 1522 may be disposed between the main printed circuit board 210 and the is support member 1400, and the third adhesive member 1530 and the fourth adhesive members 1541 and 1542 may be disposed between the secondary printed circuit board 220 and the support member 1400.

In an exemplary embodiment, the adhesive members 1500 may include one first adhesive member 1510, two second adhesive members 1521 and 1522, one third adhesive member 1530, and two fourth adhesive members 1541 and 1542. However, the exemplary embodiments are not limited thereto, and in another exemplary embodiment, the adhesive members 1500 may include two or more first adhesive members, one or three or more second adhesive members, two or more third adhesive members, and/or one or three or more fourth adhesive members.

Hereinafter, a display device according to an exemplary embodiment will be described with reference to FIGS. 8 and 9.

Figure 8:
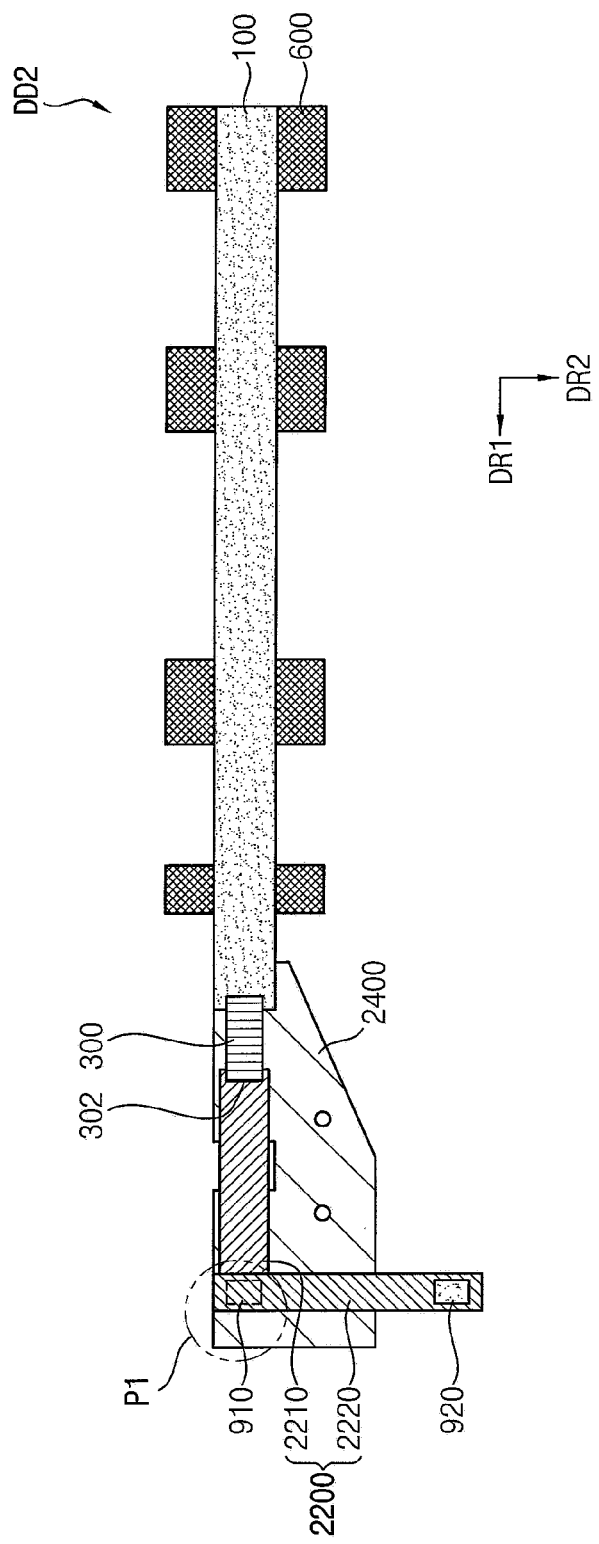
FIG. 8 is a plan view of still another exemplary embodiment of a display device constructed according to the principles of the invention.

FIG. 8 is a plan view of still another exemplary embodiment of a display device constructed according to the principles of the invention. FIG. 9 is a bottom view of the display device of FIG. 8.

Figure 9:
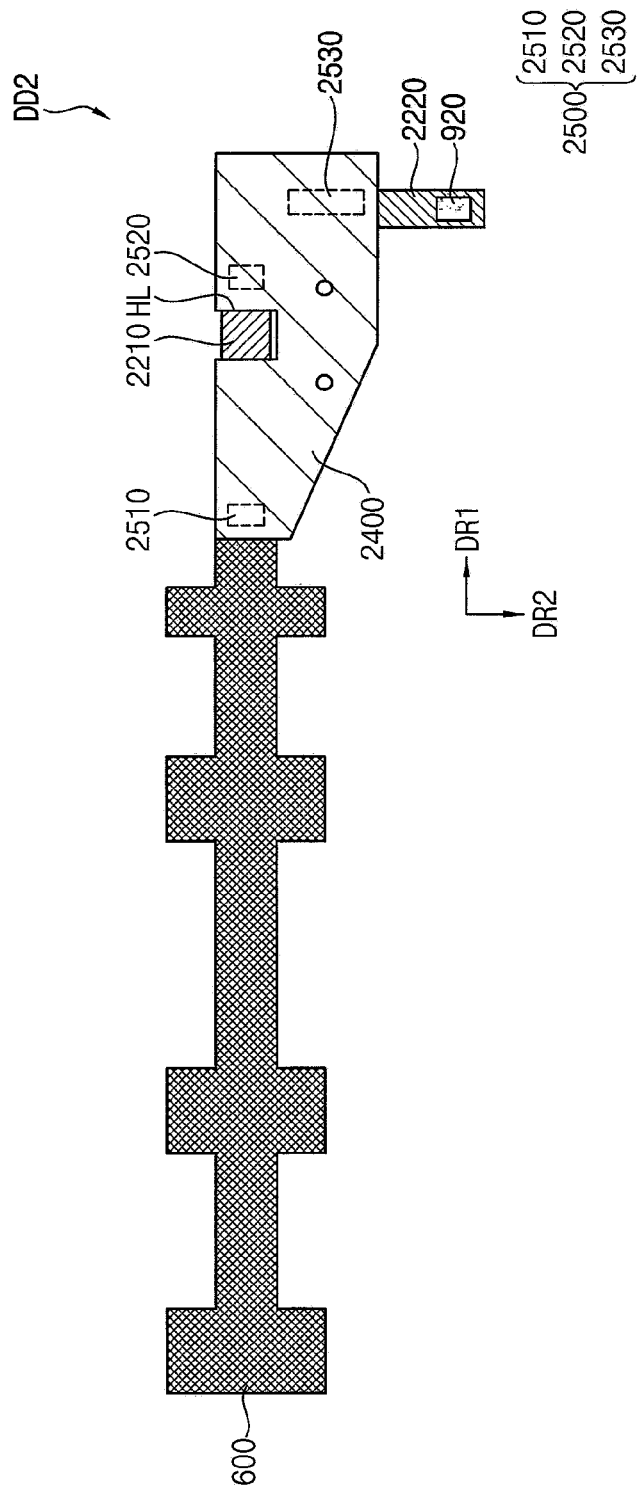
FIG. 9 is a bottom view of the display device of FIG. 8.

Referring to FIGS. 8 and 9, a display device DD2 according to an exemplary embodiment may include a display panel 100, a printed circuit board 2200, a flexible printed circuit 300, a support member 2400, a plurality of adhesive members 2500, and a lower protective film 600. The display device DD2 described with reference to FIGS. 8 and 9 may be substantially the same as or similar to the display device DD1 described with reference to FIGS. 6 and 7 except the printed circuit board 2200, the support member 2400, and the adhesive members 2500. Accordingly, descriptions on elements of the display device DD2 described with reference to FIGS. 8 and 9, which are substantially the same as or similar to those of the display device DD1 described with reference to FIGS. 6 and 7, will not be repeated to avoid redundancy.

Referring to FIG. 8, the printed circuit board 2200 may include a first portion 2210 extending in the first direction DR1 from the second end 302 of the flexible printed circuit 300 and a second portion 2220 angled in a second direction DR2 from the first portion 2210 at a first angled portion P1. For example, the second direction DR2 may be substantially perpendicular to the first direction DR1.

The printed circuit board 2200 may include a main printed circuit board 2210 and a secondary printed circuit board 2220. The main printed circuit board 2210 may be spaced apart from the display panel 100 in the first direction DR1, and may extend in the first direction DR1. For example, the main printed circuit board 2210 may be the first portion 2210 of the printed circuit board 2200. The secondary printed circuit board 2220 may be connected to the main printed circuit board 2210.

The secondary printed circuit board 2220 may be angled from the main printed circuit board 2210 in the second direction DR2. For example, the secondary printed circuit board 2220 may be the second portion 2220 of the printed circuit board 2200.

Referring to FIGS. 8 and 9, the support member 2400 may include a hole HL overlapping the printed circuit board 2200, and the hole HL may be formed at a side portion of the support member 2400. In such an exemplary embodiment, the hole HL may have a recessed shape extending toward an inner portion of the support member 2400 from the side portion of the support member 2400.

The adhesive members 2500: 2510, 2520 and 2530 may be disposed between the lower protective film 600 and the support member 2400 and between the printed circuit board 2200 and the support member 2400. The adhesive members 2500 may include one or more first adhesive members 2510 disposed between the lower protective film 600 and the support member 2400, one or more second adhesive members 2520 disposed between the first portion 2210 of FIG. 8 of the printed circuit board 2200 and the support member 2400, and one or more third adhesive members 2530 disposed between the second portion 2220 of FIG. 8 of the printed circuit board 2200 and the support member 2400. For example, the second adhesive member 2520 may be disposed between the main printed circuit board 2210 and the support member 2400, and the third adhesive member 2530 may be disposed between the secondary printed circuit board 2220 and the support member 2400.

In an exemplary embodiment, the adhesive members 2500 may include one first adhesive member 2510, one second adhesive members 2520, and one third adhesive member 2530. However, the exemplary embodiments are not limited thereto, and in another exemplary embodiment, the adhesive members 2500 may include two or more first adhesive members, two or more second adhesive members, and/or two or more third adhesive members.

The display device according to the exemplary embodiments may be applied to a display device included in a computer, a notebook, a mobile phone, a smartphone, a smart pad, a PMP, a PDA, an MP3 player, or the like.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substantially rigid display panel;
a printed circuit board spaced apart from the display panel in a first direction without overlapping the display panel in a plan view and having at least one angled portion;
a flexible member having a first portion connected to the display panel and a second portion spaced from the first portion, the second portion being connected to a first portion of the printed circuit board; and
a support attached to the display panel and the printed circuit board to support the printed circuit board, the support having at least one of a first hole overlapping the flexible member and a second hole overlapping the printed circuit board.

2. The display device of claim 1, further comprising:
a protective film disposed on a lower surface of the display panel.

3. The display device of claim 2, wherein the support is attached to a lower surface of the protective film and a lower surface of the printed circuit board.

4. The display device of claim 1, further comprising:
a plurality of adhesive members disposed between the display panel and the support and between the printed circuit board and the support.

5. The display device of claim 4, wherein the printed circuit board includes a first extending portion extending in the first direction from the second portion of the flexible member and a second extending portion angled in a second direction from the first extending portion, and
wherein the plurality of adhesive members include one or more first adhesive members disposed between the display panel and the support, one or more second adhesive members disposed between the first portion of the printed circuit board and the support, and one or more third adhesive members disposed between the second portion of the printed circuit board and the support.

6. The display device of claim 5, wherein the second direction is substantially perpendicular to the first direction.

7. The display device of claim 5, wherein the printed circuit board further includes a third extending portion extended angled in a third direction from the second extending portion, and
wherein the plurality of adhesive members further include one or more fourth adhesive members disposed between the third portion of the printed circuit board and the support.

8. The display device of claim 7, wherein the third direction is substantially perpendicular to the second direction and substantially opposite to the first direction.

9. The display device of claim 1, wherein the support comprises polyethylene terephthalate (PET).

10. The display device of claim 1, wherein the support comprises a support member having both of the first hole overlapping the flexible member and the second hole overlapping the printed circuit board.

11. The display device of claim 10, wherein the first hole and the second hole are formed at an inner portion of the support member.

12. The display device of claim 10, wherein the first hole and the second hole are formed at a side portion of the support member.

13. The display device of claim 1, wherein the flexible member comprises a flexible printed circuit, the first portion comprises a first end of the flexible printed circuit, the second portion comprises a second end of the flexible printed circuit spaced from the first end in the first direction, the first portion of the printed circuit board comprises a first end of the printed circuit board, with the second end of the flexible printed circuit being connected to the first end of the printed circuit board, and further comprising a connector connected to an external device disposed at a second end of the printed circuit board.

14. A display device comprising:
a substantially rigid display panel;
a first printed circuit board spaced apart from the display panel in a first direction and extending in the first direction without overlapping the display panel in a plan view;
a second printed circuit board connected to the first printed circuit board and being angled in a second direction from the first printed circuit board;
a flexible member having a first portion connected to the display panel and a second portion spaced from the first portion, the second portion being connected to a first portion of the first printed circuit board; and
a support attached to the display panel, the first printed circuit board, and the second printed circuit board to support the first printed circuit board and the second printed circuit board, the support having at least one of a first hole overlapping the flexible member and a second hole overlapping the first printed circuit board.

15. The display device of claim 14, further comprising:
a protective film disposed on a lower surface of the display panel.

16. The display device of claim 15, wherein the support comprises a support member attached to a lower surface of the protective film, a lower surface of the first printed circuit board, and a lower surface of the second printed circuit board.

17. The display device of claim 14, further comprising:
a plurality of adhesive members disposed between the display panel and the support, between the first printed circuit board and the support, and between the second printed circuit board and the support.

18. The display device of claim 14, wherein the first printed circuit board comprises a main printed circuit board and the second printed circuit board comprises a secondary printed circuit board, and the main and secondary printed circuit board are attached through a connector.

19. The display device of claim 18, wherein the support does not overlap the connector.

20. The display device of claim 18, wherein the support overlaps the connector.

* * * * *